(12) United States Patent
Loy et al.

(10) Patent No.: US 12,490,660 B2
(45) Date of Patent: Dec. 2, 2025

(54) STRUCTURES FOR THREE-TERMINAL MEMORY CELLS

(71) Applicant: GlobalFoundries Singapore Pte. Ltd., Singapore (SG)

(72) Inventors: Desmond Jia Jun Loy, Singapore (SG); Eng Huat Toh, Singapore (SG); Shyue Seng Tan, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 427 days.

(21) Appl. No.: 18/065,041

(22) Filed: Dec. 13, 2022

(65) Prior Publication Data

US 2024/0196626 A1  Jun. 13, 2024

(51) Int. Cl.
*H10B 63/00* (2023.01)
*H10N 70/00* (2023.01)
*H10N 70/20* (2023.01)

(52) U.S. Cl.
CPC ............ *H10N 70/24* (2023.02); *H10B 63/00* (2023.02); *H10N 70/028* (2023.02); *H10N 70/253* (2023.02); *H10N 70/823* (2023.02); *H10N 70/8833* (2023.02)

(58) Field of Classification Search
CPC .... H10B 63/20; H10N 70/253; H10N 70/823; H10N 70/883–8833
See application file for complete search history.

(56) References Cited

U.S. PATENT DOCUMENTS

| | | | |
|---|---|---|---|
| 2011/0092019 A1* | 4/2011 | Yu | H01L 21/76808 438/653 |
| 2011/0101468 A1* | 5/2011 | Nakajima | H10D 84/0177 257/E29.242 |
| 2013/0161754 A1* | 6/2013 | Su | H10D 64/017 257/369 |
| 2017/0148982 A1 | 5/2017 | Karpov et al. | |

(Continued)

FOREIGN PATENT DOCUMENTS

WO   2017111831 A1   6/2017

OTHER PUBLICATIONS

European Patent Office, Extended European Search Report and Opinion issued in European Patent Application No. 23202552.8 on May 10, 2024; 20 pages.

(Continued)

*Primary Examiner* — Erik T. K. Peterson
(74) *Attorney, Agent, or Firm* — David Cain (57) ABSTRACT

The disclosed subject matter relates generally to structures for use in memory devices. More particularly, the present disclosure relates to three terminal resistive random-access (ReRAM) memory structures having source, drain, and control electrodes. The present disclosure provides a memory structure including a source electrode having an upper surface, a drain electrode having an upper surface, a dielectric channel layer laterally between the first electrode and the second electrode, a hole generating layer on the dielectric channel layer, and a control electrode on the hole generating layer, the control electrode has an upper surface. The upper surface of the control electrode is substantially coplanar with the upper surface of the source electrode and the upper surface of the drain electrode.

14 Claims, 8 Drawing Sheets

(56) References Cited

U.S. PATENT DOCUMENTS

2020/0395069 A1  12/2020  Tang et al.
2021/0407590 A1  12/2021  Van Dal et al.
2022/0209107 A1   6/2022  Onen et al.

OTHER PUBLICATIONS

Lee et al.; Understanding of proton induced synaptic behaviors in three-terminal synapse device for neuromorphic systems; Apr. 5, 2019; vol. 30, No. 25; IOP Publishing; Bristol, UK.
K. Moon, et. al. "RRAM-based synapse devices for neuromorphic systems" Faraday Discuss., 2019, 213, 421.
J. Lee, et al. "Understanding of proton induced synaptic behaviors in three-terminal synapse device for neuromorphic systems", Nanotechnology 30 (2019) 255202 (6pp).
Y. Xi, et. al. "Mechanism of Hydrogen Spillover on WO(001) and Formation of $H_xWO_3$ (x =0.125, 0.25, 0.375, and 0.5)", J. Phys. Chem. C 2014, 118 494-501.
E. Herrmann, A. Rush, T. Bailey and R. Jha, "Gate Controlled Three-Terminal Metal Oxide Memristor," in IEEE Electron Device Letters, vol. 39, No. 4, pp. 500-503, Apr. 2018, doi: 10.1109/LED.2018.2806188.

\* cited by examiner

STRUCTURES FOR THREE-TERMINAL MEMORY CELLS

FIELD OF THE INVENTION

The disclosed subject matter relates generally to structures for use in memory devices. More particularly, the present disclosure relates to three terminal resistive random-access (ReRAM) memory structures having source, drain, and control electrodes.

BACKGROUND

Semiconductor devices and integrated circuit (IC) chips have found numerous applications in the fields of physics, chemistry, biology, computing, and memory devices. An example of a memory device is a non-volatile (NV) memory device. NV memory devices are programmable and have been extensively used in electronic products due to their ability to retain data for long periods, even after the power has been turned off. Exemplary categories for NV memory may include resistive random-access memory (ReRAM), erasable programmable read-only memory (EPROM), flash memory, ferroelectric random-access memory (FeRAM), and magnetoresistive random-access memory (MRAM).

A ReRAM device includes a switching layer that is positioned between a bottom electrode and a top electrode. The ReRAM device can be programmed by changing the resistance across the switching layer to provide different content-storage states, namely a high-resistance state (HRS) and a low-resistance state (LRS), representing the stored bits of data. The switching layer can be modified by applying a programming voltage sufficient to create one or more conductive filaments bridging across the thickness of the switching layer, which sets the low-resistance state. The conductive filaments may be formed, for example, by the diffusion of a conductive species (e.g., metal ions) from one or both of the electrodes into the switching layer. The conductive filaments can be destroyed, also by the application of a programming voltage, to reset the resistive memory element to the high-resistance state. The content-storage state can be read by measuring a voltage drop across the resistive memory element after it is programmed.

SUMMARY

In an aspect of the present disclosure, there is provided a memory structure including a source electrode having an upper surface, a drain electrode having an upper surface, a dielectric channel layer laterally between the source electrode and the drain electrode, a hole generating layer on the dielectric channel layer, and a control electrode on the hole generating layer, the control electrode has an upper surface. The upper surface of the control electrode is substantially coplanar with the upper surface of the source electrode and the upper surface of the drain electrode.

In another aspect of the present disclosure, there is provided a memory structure including a dielectric region, a source electrode in the dielectric region, a drain electrode in the dielectric region, a dielectric channel layer in the dielectric region, the dielectric channel layer is laterally between the source electrode and the drain electrode, a hole generating layer in the dielectric region, the hole generating layer is on the dielectric channel layer, and a control electrode in the dielectric region, the control electrode has sidewalls and a bottom surface. The hole generating layer is on the sidewalls and the bottom surface of the control electrode.

BRIEF DESCRIPTION OF THE DRAWINGS

The present disclosure may be understood by reference to the following description taken in conjunction with the accompanying drawings.

For simplicity and clarity of illustration, the drawings illustrate the general manner of construction, and certain descriptions and details of features and techniques may be omitted to avoid unnecessarily obscuring the discussion of the described embodiments of the present disclosure. Additionally, elements in the drawings are not necessarily drawn to scale. For example, the dimensions of some of the elements in the drawings may be exaggerated relative to other elements to help improve understanding of embodiments of the present disclosure. The same reference numerals in different drawings denote the same elements, while similar reference numerals may, but do not necessarily, denote similar elements.

DETAILED DESCRIPTION

Various illustrative embodiments of the present disclosure are described below. The embodiments disclosed herein are exemplary and not intended to be exhaustive or limiting to the present disclosure.

Figure 1:
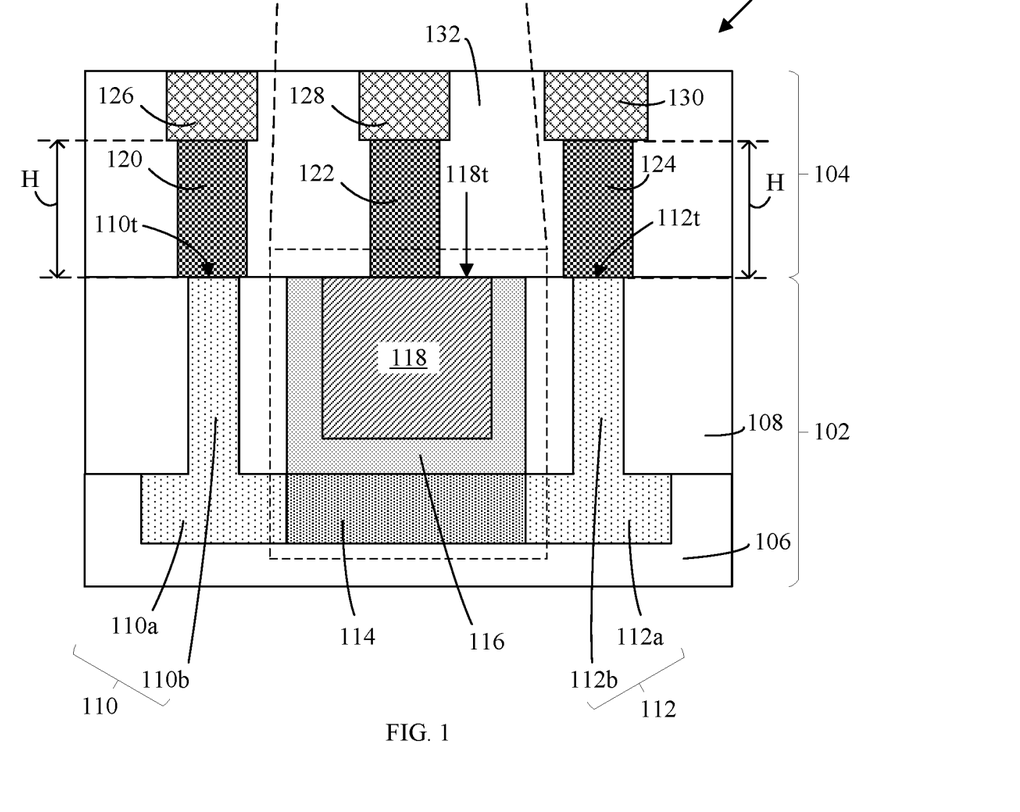
FIG. 1 is a cross-sectional view of an example memory structure.
Figure 1A:
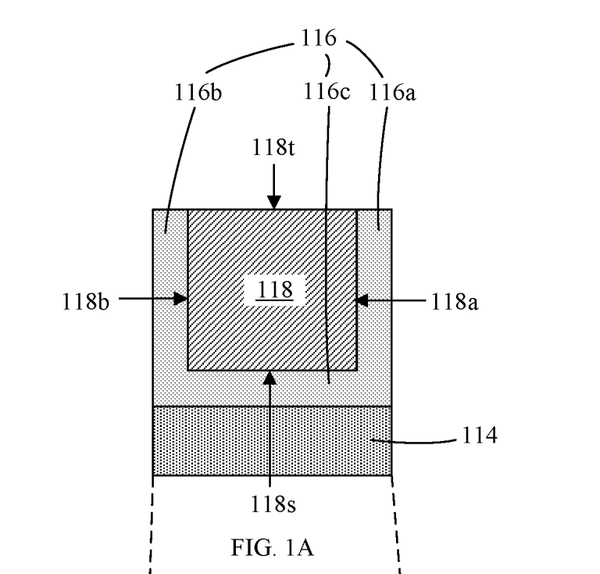
FIG. 1A is an enlarged cross-sectional view depicting an arrangement of a hole-generating layer and a control electrode in the example memory structure shown in FIG. 1.

Referring to FIG. 1 and FIG. 1A, an example memory structure 100A may include a source electrode 110, a drain electrode 112, a dielectric channel layer 114 laterally between the source electrode 110 and the drain electrode 112, a hole generating layer 116 on or directly on the dielectric channel layer 114, and a control electrode 118 on or directly on the hole generating layer 116. The source electrode 110, the drain electrode 112, the dielectric channel layer 114, the hole generating layer 116, and the control electrode 118 may provide a memory cell, or a single memory cell unit. The memory structure 100A may be formed above a substrate (not shown). The source electrode 110 may have an upper surface 110t. The drain electrode 112 may have an upper surface 112t. The control electrode 118 may have an upper surface 118t. The upper surface 110t of the source electrode 110, the upper surface 112t of the drain electrode 112, and the upper surface 118t of the control electrode 118 may be substantially coplanar with each other. For example, the upper surface 118t of the control electrode 118 may be substantially coplanar with the upper surface 110t of the source electrode 110 and the upper surface 112t of the drain electrode 112. Advantageously, by having the upper surfaces 110t, 112t, 118t be substantially coplanar with each other, any electrical shorts between the control electrode 118 and the second and third vias 120 and 124, respectively, can be avoided. The control electrode 118 may have one or more sides 118a, 118b and a lower surface 118s. For example, the control electrode 118 may have a first side 118a and a second side 118b, in which the first side 118a may be oppositely facing the second side 118b. The lower surface 118s may adjoin the first side 118a and the second side 118b.

The hole generating layer 116 may be positioned on the sides 118a, 118b and the lower surface 118s of the control electrode 118. The hole generating layer 116 may have two vertical segments 116a, 116b and a horizontal segment 116c. The horizontal segment 116c may be laterally between the two vertical segments 116a, 116b. The two vertical segments 116a, 116b may be oppositely facing each other. As shown in FIG. 1A, a first vertical segment 116a of the hole generating layer 116 may be on or directly on the first side 118a of the control electrode 118, a second vertical segment 116b of the hole generating layer 116 may be on or directly on the second side 118b of the control electrode 118, and the horizontal segment 116c of the hole generating layer 116 may be on or directly on the lower surface 118s of the control electrode 118.

The dielectric channel layer 114 may directly abut or directly contact the source electrode 110 and the drain electrode 112. The dielectric channel layer 114 may be positioned below and may directly contact the horizontal segment 116c of the hole generating layer 116. The source electrode 110 may have an upper surface 110t and the drain electrode 112 may have an upper surface 112t. Interconnect features, such as vias and conductive lines, may be formed over the control electrode 118, the source electrode 110, and the drain electrode 112. These interconnect features may provide routing or wiring of electrical signals and may connect various devices or components within an IC chip to perform desired functions. As shown, the memory structure 100A may further include a first via 122 on the upper surface 118t of the control electrode 118, a second via 120 on the upper surface 110t of the source electrode 110, and a third via 124 on the upper surface 112t of the drain electrode 112. A first conductive line 128 may be on the first via 122, a second conductive line 126 may be on the second via 120, and a third conductive line 130 may be on the third via 124.

The memory structure 100A may also include a first dielectric region 102 and a second dielectric region 104 on or directly on the first dielectric region 102. The dielectric regions 102, 104 may be a region formed by the middle of line (MOL) or back end of line (BEOL) processing of an IC chip. The dielectric regions 102, 104 may include a metallization level. The source electrode 110, the drain electrode 112, and the control electrode 118 may be in the first dielectric region 102. The first via 122, the second via 120, the third via 124, the first conductive line 128, the second conductive line 126, and the third conductive line 130 may be in the second dielectric region 104. The first via 122, the second via 120, and the third via 124 may each have a height defined as a vertical distance between the respective upper surface 110t, 112t, 118t of the electrodes 110, 112, 118 and the respective conductive lines 126, 128, 130. As shown in FIG. 1, the first via 122, the second via 120, and the third via 124 may have the same height H. For example, the heights of the vias 120, 122, 124 may be either identical with each other or within 10% of each other.

In the example shown in FIG. 1, the first dielectric region 102 may include a first dielectric layer 106 and a second dielectric layer 108 on or directly on the first dielectric layer 106. The second dielectric region 104 may include a third dielectric layer 132. The dielectric channel layer 114 may be in the first dielectric layer 106. The hole generating layer 116 and the control electrode 118 may be in the second dielectric layer 108. The source electrode 110 may include an upper section 110b on a lower section 110a, the lower section 110a having a larger width than the upper section 110b. The drain electrode 112 may include an upper section 112b on a lower section 112a, the lower section 112a having a larger width than the upper section 112b. The upper section 110b of the source electrode 110 and the upper section 112b of the drain electrode 112 are in the second dielectric layer 108, and the lower section 110a of the source electrode 110 and the lower section 112a of the drain electrode 112 are in the first dielectric layer 106. The upper section 110b of the source electrode 110 and the upper section 112b of the drain electrode 112 may be isolated from the hole generating layer 116 by the second dielectric layer 108.

The source electrode 110, the drain electrode 112, and the control electrode 118 may include a metal. Examples of the metal for the source electrode 110, the drain electrode 112, and the control electrode 118 may include, but are not limited to, tungsten, molybdenum, vanadium, strontium, cobalt, tantalum, titanium, hafnium, copper, aluminum, or an alloy thereof. In an embodiment, the electrodes 110, 112, 118 may have the same material. In another embodiment, the source electrode 110, the drain electrode 112, and the control electrodes 118 have different materials from each other. In yet another embodiment, the source electrode 110 and the drain electrode 112 may have the same material while the control electrode 118 may have a different material from the source electrode 110 and the drain electrode 112.

The dielectric channel layer 114 may include an oxide. In some embodiments, the dielectric channel layer 114 may include an oxide of the metal in the source electrode 110 and the drain electrode 112. In other embodiments, the dielectric channel layer 114 may include an oxide of tungsten, molybdenum, vanadium, or strontium cobalt alloy. The hole generating layer 116 may include a material saturated with hydrogen. For example, the material may have a crystalline structure and have hydrogen gas intercalated at the interstitial defect sites in the material. The hole generating layer 116 may include a hydrogen doped dielectric material or a hydrogen doped metal. For example, the hole generating layer 116 may include hydrogen doped silicon dioxide ($SiO_2$—H), platinum hydride (Pt—H), or palladium hydride (Pd—H). The hole generating layer 116 may be capable of providing holes (i.e., positive charge carriers or protons) that migrate from the hole generating layer 116 towards the dielectric channel layer 114 under the influence of an electric field.

As an illustrative example, during the operation of the memory structure 100A, a bias voltage may be applied to the control electrode 118. The number of holes migrated towards the dielectric channel layer 114 may be dependent on the magnitude and direction of the bias voltage. A current may be allowed to flow through the dielectric channel layer 114 and between the source electrode 110 and the drain electrode 112. The migration of holes in and out of the dielectric channel layer 114 may increase or decrease the conductance of the dielectric channel layer 114, thereby increasing or decreasing the current flow between the source electrode 110 and the drain electrode 112. Thus, the control of the bias voltage applied to the control electrode 118 may modulate the conductance of the dielectric channel layer 114.

Examples of the material for the dielectric layers 106, 108, 132 may include, but are not limited to, silicon dioxide ($SiO_2$), silicon oxynitride (SiON), silicon nitride ($Si_3N_4$), Nitrogen doped silicon carbide (SiCN), $SiC_xH_z$ (i.e., BLoK™), or $SiN_wC_xH_z$ (i.e., NBLoK™), wherein each of w, x, y, and z independently has a value greater than 0 and less than 0.75, tetraethyl orthosilicate (TEOS), or a material having a chemical composition of $SiC_xO_yH_z$, wherein x, y, and z are in stoichiometric ratio. The second dielectric layer 108 may be of a different material from the first dielectric layer 106. In some embodiments, the second dielectric layer 108 may include silicon nitride.

Figure 2:
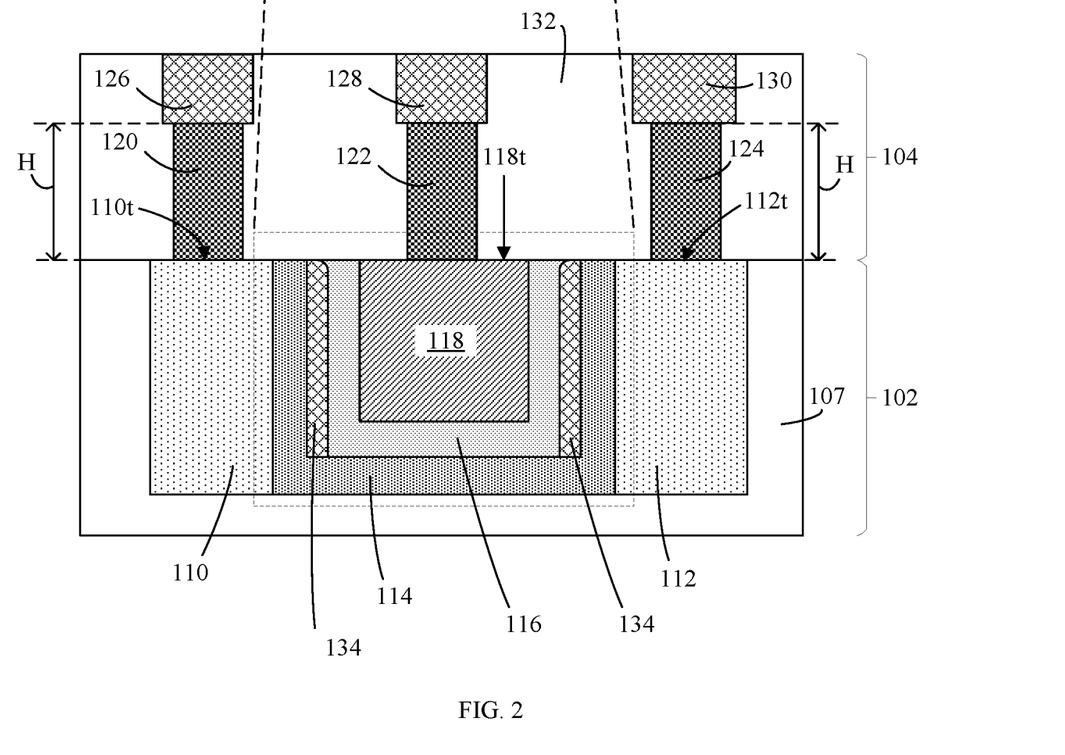
FIG. 2 is a cross-sectional view of another example memory structure.
Figure 2A:
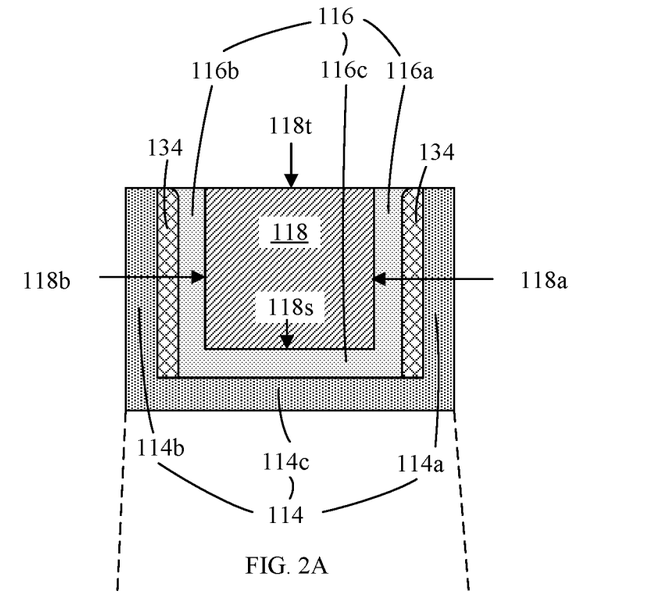
FIG. 2A is an enlarged cross-sectional view depicting an arrangement of a hole-generating layer and a control electrode in the example memory structure shown in FIG. 2.

Referring to FIG. 2 and FIG. 2A, another example memory structure 100B is shown. The memory structure 100B may include a source electrode 110, a drain electrode 112, a dielectric channel layer 114 laterally between the source electrode 110 and the drain electrode 112, a hole generating layer 116 on or directly on the dielectric channel layer 114, and a control electrode 118 on or directly on the hole generating layer 116. The source electrode 110, the drain electrode 112, the dielectric channel layer 114, the hole generating layer 116, and the control electrode 118 may provide a memory cell, or a single memory cell unit. The memory structure 100B may be formed above a substrate (not shown). The source electrode 110 may have an upper surface 110t. The drain electrode 112 may have an upper surface 112t. The control electrode 118 may have an upper surface 118t. The upper surface 110t of the source electrode 110, the upper surface 112t of the drain electrode 112, and the upper surface 118t of the control electrode 118 may be substantially coplanar with each other. For example, the upper surface 118t of the control electrode 118 may be substantially coplanar with the upper surface 110t of the source electrode 110 and the upper surface 112t of the drain electrode 112. Advantageously, by having the upper surfaces 110t, 112t, 118t be substantially coplanar with each other, any electrical shorts between the control electrode 118 and the second and third vias 120 and 124, respectively, can be avoided. The control electrode 118 may have one or more sides 118a, 118b and a lower surface 118s. For example, the control electrode 118 may have a first side 118a and a second side 118b, in which the first side 118a may be oppositely facing the second side 118b. The lower surface 118s may adjoin the first side 118a and the second side 118b.

The hole generating layer 116 may be positioned on the sides 118a, 118b and the lower surface 118s of the control electrode 118. The hole generating layer 116 may have two vertical segments 116a, 116b and a horizontal segment 116c. The horizontal segment 116c may be laterally between the two vertical segments 116a, 116b. The two vertical segments 116a, 116b may be oppositely facing each other. As shown in FIG. 2A, a first vertical segment 116a of the hole generating layer 116 may be on or directly on the first side 118a of the control electrode 118, a second vertical segment 116b of the hole generating layer 116 may be on or directly on the second side 118b of the control electrode 118, and the horizontal segment 116c of the hole generating layer 116 may be on or directly on the lower surface 118s of the control electrode 118.

The dielectric channel layer 114 may directly abut or directly contact the source electrode 110 and the drain electrode 112. The dielectric channel layer 114 may have two vertical segments 114a, 114b and a horizontal segment 114c. The horizontal segment 114c may be laterally between the two vertical segments 114a, 114b. The two vertical segments 114a, 114b may be oppositely facing each other. The horizontal segment 114c of the dielectric channel layer 114 may be positioned below and may directly contact the horizontal segment 116c of the hole generating layer 116. The two vertical segments 114a, 114b of the dielectric channel layer 114 may be isolated from the two vertical segments 116a, 116b of the hole generating layer 116 by spacer layers 134. The spacer layers 134 may include, but are not limited to, silicon dioxide ($SiO_2$), silicon oxynitride (SiON), silicon nitride ($Si_3N_4$), Nitrogen doped silicon carbide (SiCN), $SiC_xH_z$ (i.e., BLoK™), or $SiN_wC_xH_z$ (i.e., NBLoK™), wherein each of w, x, y, and z independently has a value greater than 0 and less than 0.75, tetraethyl orthosilicate (TEOS), or a material having a chemical composition of $SiC_xO_yH_z$, wherein x, y, and z are in stoichiometric ratio. Each spacer layer 134 may include multiple sub-layers of material, or alternatively, may be of a single layer of material. The spacer layers 134 may serve to prevent the migration of holes from the vertical segments 116a, 116b of the hole generating layer 116 to the vertical segments 114a, 114b of the dielectric channel layer 114 so that the migration of holes occurs only between the horizontal segment 116c of the hole generating layer 116 and the horizontal segment 114c of the dielectric channel layer 114.

The source electrode 110 may have an upper surface 110t and the drain electrode 112 may have an upper surface 112t. Interconnect features, such as vias and conductive lines, may be formed over the control electrode 118, the source electrode 110, and the drain electrode 112. These interconnect features may provide routing or wiring of electrical signals and may connect various devices or components within an IC chip to perform desired functions. As shown, the memory structure 100B may further include a first via 122 on the upper surface 118t of the control electrode 118, a second via 120 on the upper surface 110t of the source electrode 110, and a third via 124 on the upper surface 112t of the drain electrode 112. A first conductive line 128 may be on the first via 122, a second conductive line 126 may be on the second via 120, and a third conductive line 130 may be on the third via 124.

The memory structure 100B may also include a first dielectric region 102 and a second dielectric region 104 on or directly on the first dielectric region 102. The dielectric regions 102, 104 may be a region formed by the middle of line (MOL) or back end of line (BEOL) processing of an IC chip. The dielectric regions 102, 104 may include a metallization level. The source electrode 110, the drain electrode 112, the control electrode 118, the hole generating layer 116, and the dielectric channel layer 114 may be in the first dielectric region 102. The first via 122, the second via 120, the third via 124, the first conductive line 128, the second conductive line 126, and the third conductive line 130 may be in the second dielectric region 104. The first via 122, the second via 120, and the third via 124 may each have a height defined as a vertical distance between the respective upper surface 110t, 112t, 118t of the electrodes 110, 112, 118 and the respective conductive lines 126, 128, 130. As shown in FIG. 2, the first via 122, the second via 120, and the third via 124 may have the same height H. For example, the heights of the vias 120, 122, 124 may be either identical with each other or within 10% of each other.

In the example shown in FIG. 2, the first dielectric region 102 may include a dielectric layer 107 while the second dielectric region 104 may include a dielectric layer 132. Examples of material for the dielectric layers 107, 132 may include, but are not limited to, silicon dioxide ($SiO_2$), silicon oxynitride (SiON), silicon nitride ($Si_3N_4$), Nitrogen doped silicon carbide (SiCN), $SiC_xH_z$ (i.e., BLoK™), or $SiN_wC_xH_z$ (i.e., NBLoK™), wherein each of w, x, y, and z independently has a value greater than 0 and less than 0.75, tetraethyl orthosilicate (TEOS), or a material having a chemical composition of $SiC_xO_yH_z$, wherein x, y, and z are in stoichiometric ratio. The dielectric layers 107, 132 may include a different material from the spacer layers 134.

The source electrode 110, the drain electrode 112, and the control electrode 118 may include a metal. Examples of the metal for the source electrode 110, the drain electrode 112, and the control electrode 118 may include, but are not limited to, tungsten, molybdenum, vanadium, strontium, cobalt, tantalum, titanium, hafnium, copper, aluminum, or an alloy thereof. In an embodiment, the electrodes 110, 112, 118 may have the same material. In another embodiment, the source electrode 110, the drain electrode 112, and the control electrodes 118 have different materials from each other. In yet another embodiment, the source electrode 110 and the drain electrode 112 may have the same material while the control electrode 118 may have a different material from the source electrode 110 and the drain electrode 112.

The dielectric channel layer 114 may include an oxide. In some embodiments, the dielectric channel layer 114 may include an oxide of the metal in the source electrode 110 and the drain electrode 112. In other embodiments, the dielectric channel layer 114 may include an oxide of tungsten, molybdenum, vanadium, or strontium cobalt alloy.

The hole generating layer 116 may include a hydrogen doped dielectric material or a hydrogen doped metal. For example, the hole generating layer 116 may include hydrogen doped generating layer 116 may be capable of providing holes (i.e., positive charge carriers or protons) that migrate from the hole generating layer 116 towards the dielectric channel layer 114 under the influence of an electric field. As an illustrative example, during the operation of the memory structure 100B, a bias voltage may be applied to the control electrode 118. The number of holes migrated towards the dielectric channel layer 114 may be dependent on the magnitude and direction of the bias voltage. A current may be allowed to flow through the dielectric channel layer 114 and between the source electrode 110 and the drain electrode 112. The migration of holes in and out of the dielectric channel layer 114 may increase or decrease the conductance of the dielectric channel layer 114, thereby increasing or decreasing the current flow between the source electrode 110 and the drain electrode 112. Thus, the control of the bias voltage applied to the control electrode 118 may modulate the conductance of the dielectric channel layer 114.

FIGS. 3 through 8 show structures at successive fabrication stages of a processing method for fabricating an exemplary memory structure shown in FIG. 1.

As used herein, "deposition techniques" refer to the process of applying a material over another material (or the substrate). Exemplary techniques for deposition include, but are not limited to, spin-on coating, sputtering, chemical vapor deposition (CVD), physical vapor deposition (PVD), molecular beam deposition (MBD), pulsed laser deposition (PLD), liquid source misted chemical deposition (LSMCD), atomic layer deposition (ALD).

Additionally, "patterning techniques" include deposition of material or photoresist, patterning, exposure, development, etching, cleaning, and/or removal of the material or photoresist as required in forming a described pattern, structure, or opening. Examples of techniques for patterning include, but are not limited to, wet etch lithographic processes, dry etch lithographic processes, or direct patterning processes. Such techniques may use mask sets and mask layers.

Figure 3:
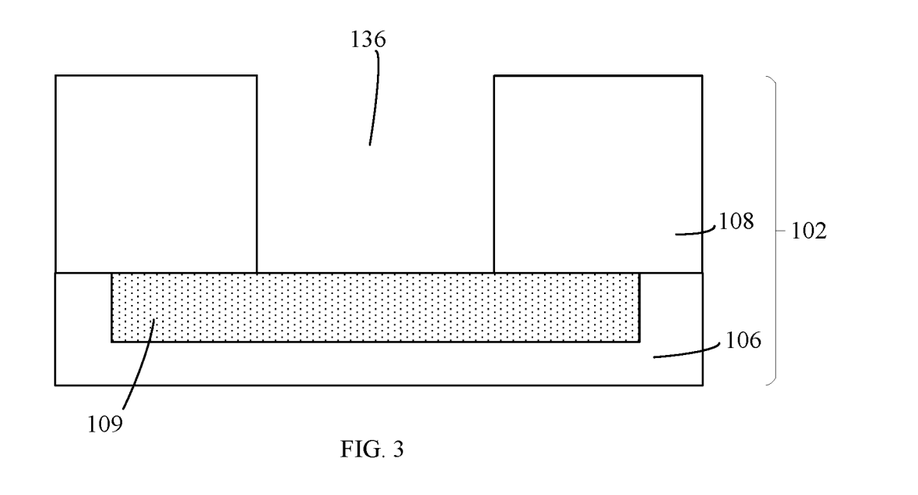
FIG. 3 through FIG. 8 are cross-sectional views depicting structures at successive fabrication stages of a processing method for fabricating an exemplary memory structure shown in FIG. 1.

Referring to FIG. 3, a metal layer 109 may be formed in a first dielectric layer 106. A second dielectric layer 108 may be formed on the first dielectric layer 106, for example, using the deposition techniques. The first dielectric layer 106 and the second dielectric layer 108 may provide a first dielectric region 102. An opening 136 may be formed in the second dielectric layer 108, for example, using the patterning techniques. The formation of the opening 136 may partially expose the metal layer 109.

Figure 4:
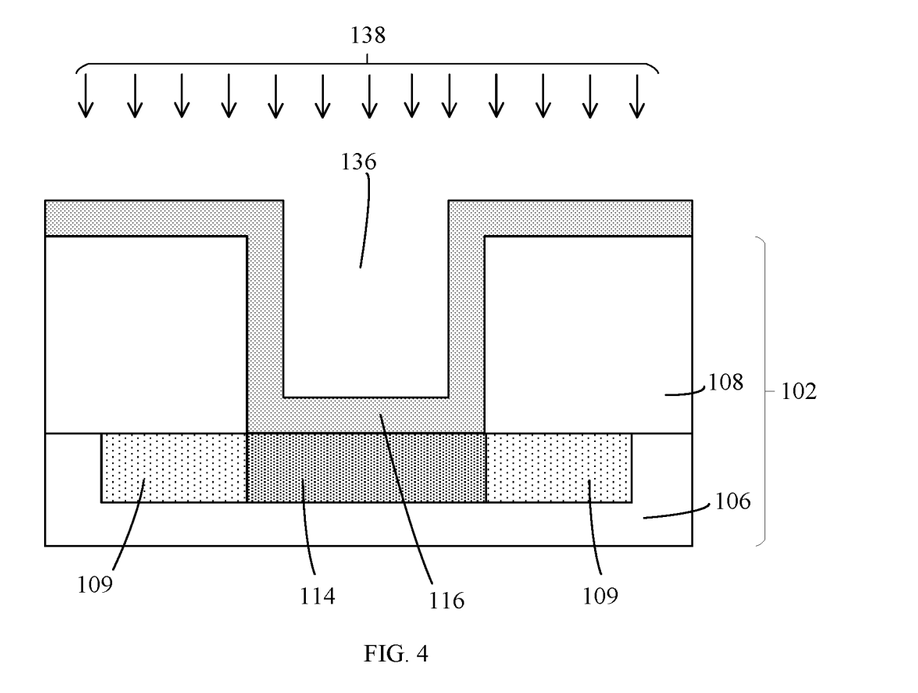

Referring to FIG. 4, a dielectric channel layer 114 may be formed by oxidation of the exposed portion of the metal layer 109 using an oxidizing agent such as oxygen gas. For example, the second dielectric layer 108 may serve as a mask to protect areas of the metal layer 109 from contact with the oxidizing agent. The exposed portion of the metal layer 109 below the opening 136 may be oxidized to form a metal oxide using reactive sputtering process. A hole generating layer 116 may be formed in the opening 136, for example, using deposition techniques. In an example, the hole generating layer 116 may be formed by conformal deposition of a silicon dioxide layer. The silicon dioxide layer may be injected, doped, or sputtered by a forming gas 138, such as hydrogen gas. In another example, the hole generating layer 116 may be formed by depositing platinum or palladium. The deposited platinum or palladium may be injected, doped, or sputtered by the forming gas 138 such that the platinum or palladium is saturated with the forming gas.

Figure 5:
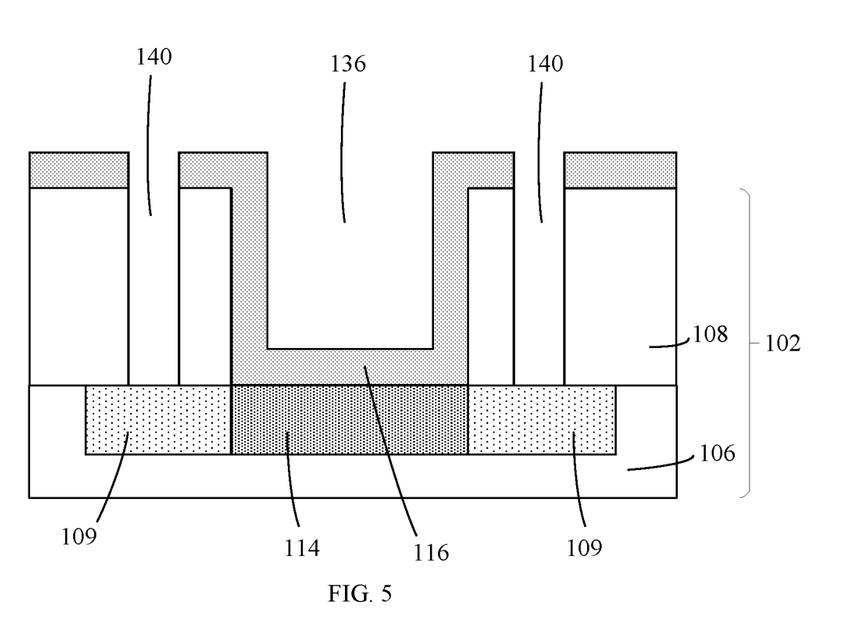
Figure 6:
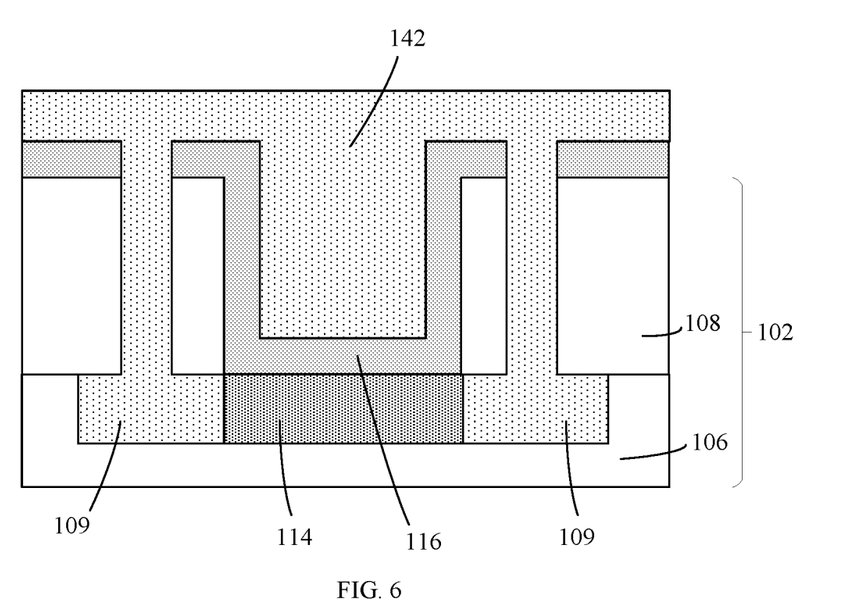

Referring to FIG. 5, electrode openings 140 may be formed in the dielectric layer 108, for example, using patterning techniques. In an implementation, the dielectric layer 108 and the hole generating layer 116 may be etched such that the electrode openings 140 are aligned vertically above the portion of the metal layer 109 that has not been oxidized. Referring to FIG. 6, the electrode openings 140 and the opening 136 may be filled with a metal layer 142. The metal layer 142 may be formed using deposition techniques. The metal layer 142 may be of the same material as the metal layer 109. The metal layer 142 may also be formed over the hole generating layer 116 and the dielectric layer 108.

Figure 7:
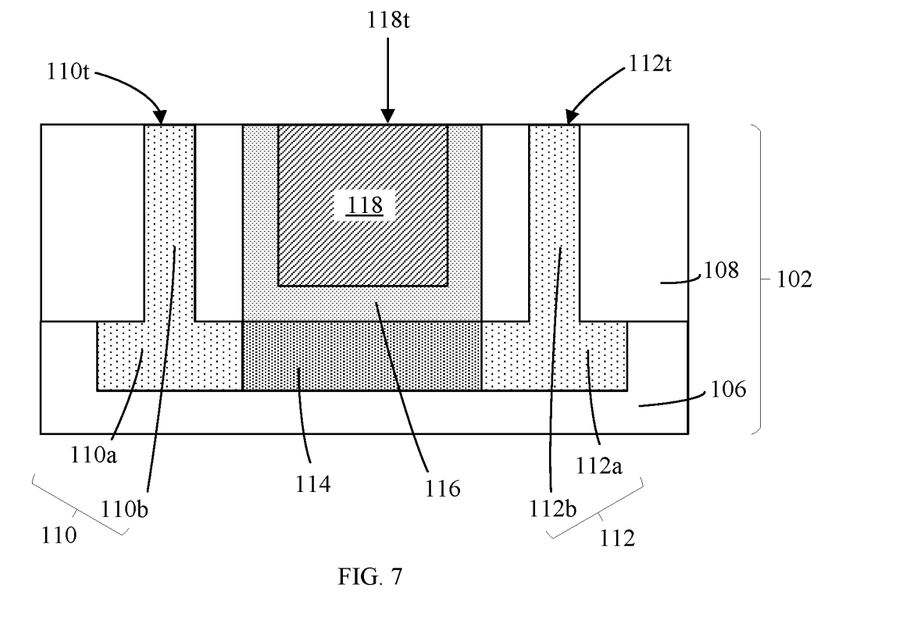

Referring to FIG. 7, a chemical mechanical planarization (CMP) process may be performed on the structure shown in FIG. 6 to remove portions of the metal layer 142 and the hole generating layer 116 that were overlying the dielectric layer 108. A source electrode 110, a drain electrode 112, and a control electrode 118 may be formed after the CMP process. The source electrode 110 may have an upper section 110*b* and a lower section 110*a*. The drain electrode 112 may have an upper section 112*b* and a lower section 112*a*. The CMP process may also form an upper surface 110*t* of the source electrode 110, an upper surface 112*t* of the drain electrode 112, and an upper surface 118*t* of the control electrode 118. In an implementation, the source electrode 110, the drain electrode 112, and the control electrode 118 may include the same metal.

Figure 8:
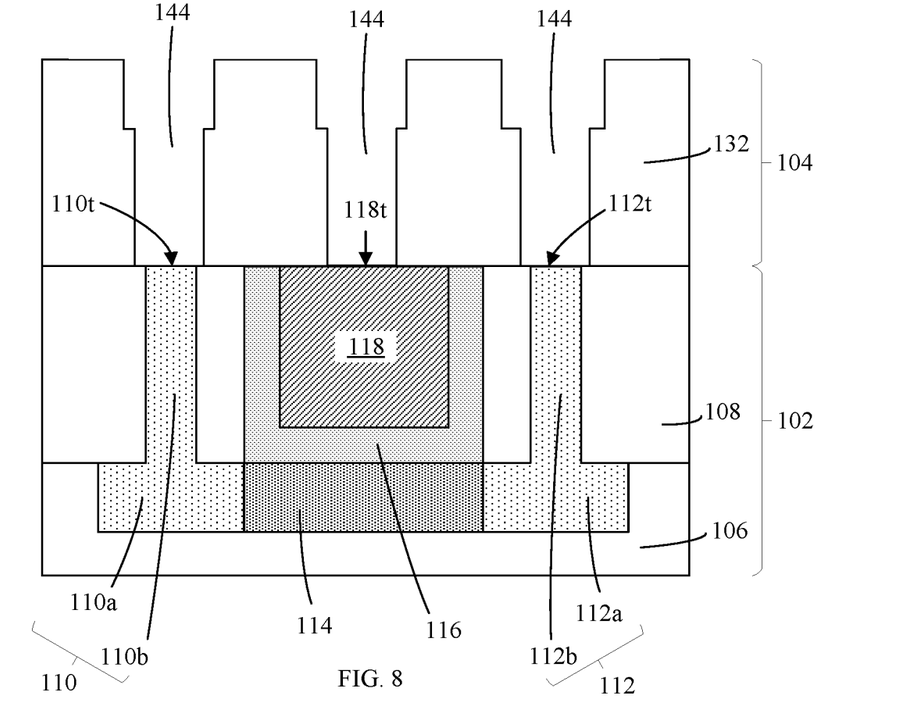

Referring to FIG. 8, a second dielectric region 104 may be formed on the first dielectric region 102. The second dielectric region 104 may include a dielectric layer 132 which may be formed on the dielectric layer 108 using the deposition techniques described herein. Interconnect openings 144 may be formed in the dielectric layer 132 using patterning techniques. Vias and conductive lines, as described in FIG. 1, may be formed in the interconnect openings 144, for example, by forming a metal, such as cobalt (Co), copper (Cu), aluminum (Al), or an alloy thereof, in the interconnect openings 144. Other suitable types of metals or alloys may also be useful. The interconnect openings 144 may be formed such that they are aligned vertically above the upper surface 110t of the source electrode 110, the upper surface 112t of the drain electrode 112, and the upper surface 118t of the control electrode 118.

FIGS. 9 through 14 show structures at successive fabrication stages of a processing method for fabricating an exemplary memory structure shown in FIG. 2.

Figure 9:
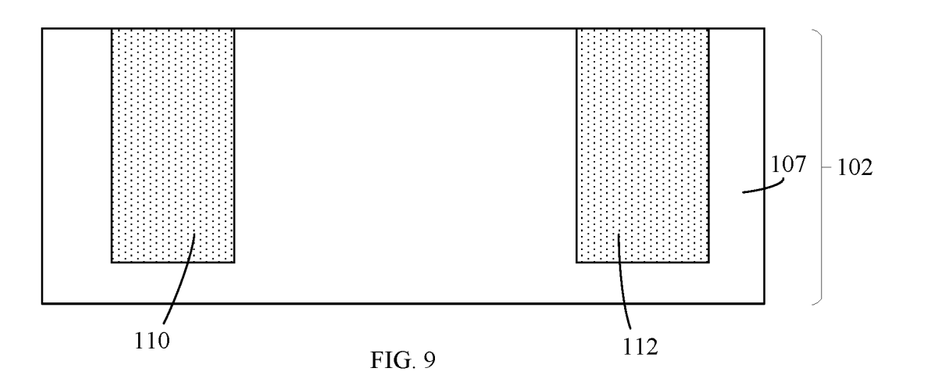
FIG. 9 through FIG. 14 are cross-sectional views depicting structures at successive fabrication stages of a processing method for fabricating another exemplary memory structure shown in FIG. 2.
Figure 10:
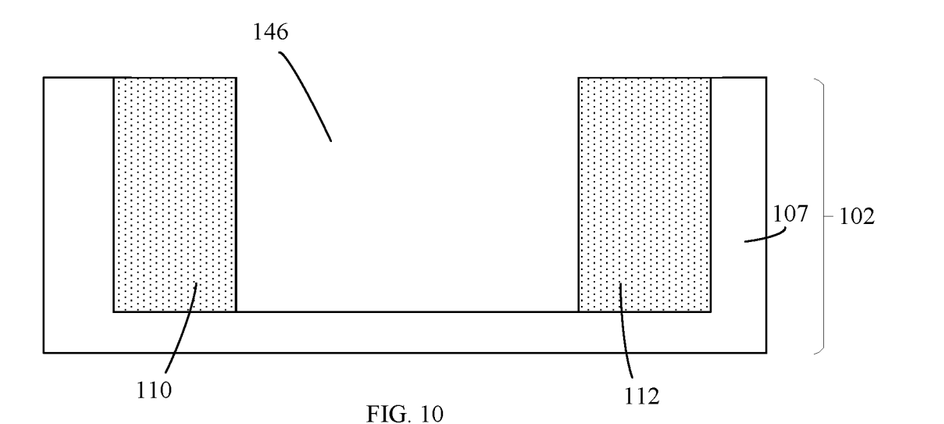
Figure 11:
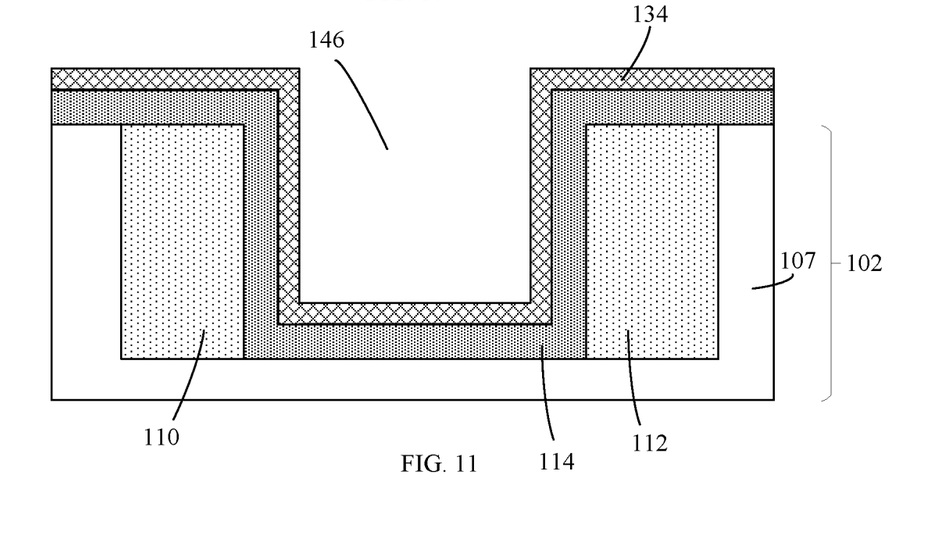

Referring to FIG. 9 and FIG. 10, a source electrode 110 and a drain electrode 112 may be formed in a dielectric region 102. The source electrode 110 and the drain electrode 112 may be laterally spaced apart from each other. The dielectric region 102 may include a dielectric layer 107. The dielectric layer 107 may be patterned using patterning techniques to form an opening 146 laterally between the source electrode 110 and the drain electrode 112. A mask layer (not shown) may be used in the patterning of the dielectric layer 107. Referring to FIG. 11, a dielectric channel layer 114 and a spacer layer 134 may be formed in the opening 146. The dielectric channel layer 114 and the spacer layer 134 may be formed using a deposition technique, and preferably, using conformal deposition (e.g., ALD).

Figure 12:
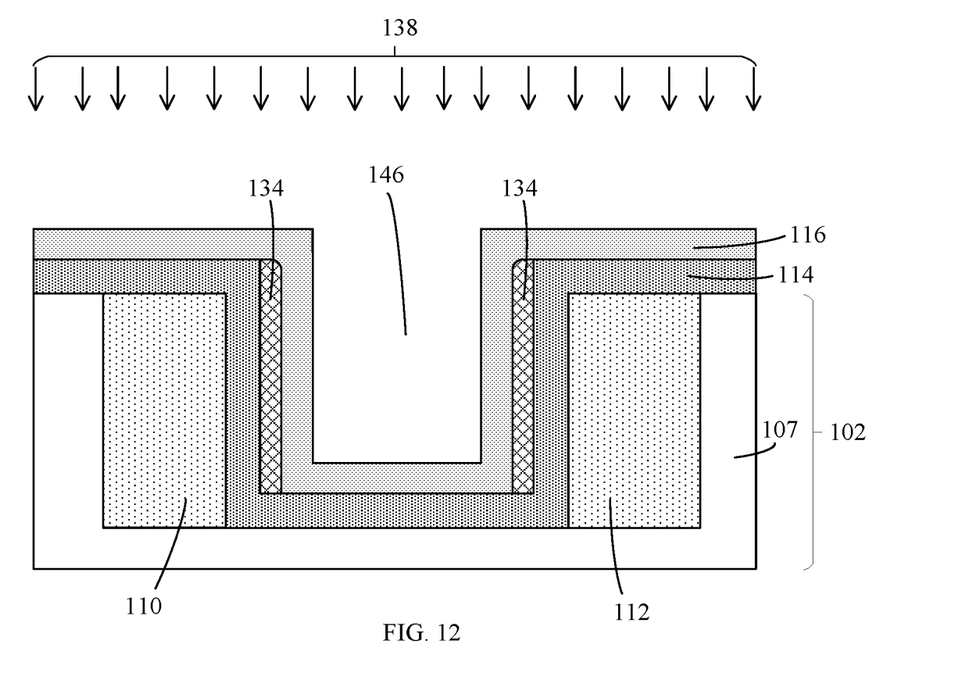

Referring to FIG. 12, the spacer layer 134 may be etched using a directional etching such as anisotropic etching. For example, the etching of the spacer layer 134 may be performed in a vertical direction such that horizontal segments of the spacer layer 134 may be removed while vertical segments of the spacer layer 134 are retained. A hole generating layer 116 may be formed in the opening 146, for example, using deposition techniques. The hole generating layer 116 may be formed on the spacer layer 134 and the dielectric channel layer 114. In an example, the hole generating layer 116 may be formed by conformal deposition of a silicon dioxide layer. The silicon dioxide layer may be injected, doped, or sputtered by a forming gas 138, such as hydrogen gas. In another example, the hole generating layer 116 may be formed by depositing platinum or palladium. The deposited platinum or palladium may be injected, doped, or sputtered by the forming gas 138 such that the platinum or palladium is saturated with the forming gas.

Figure 13:
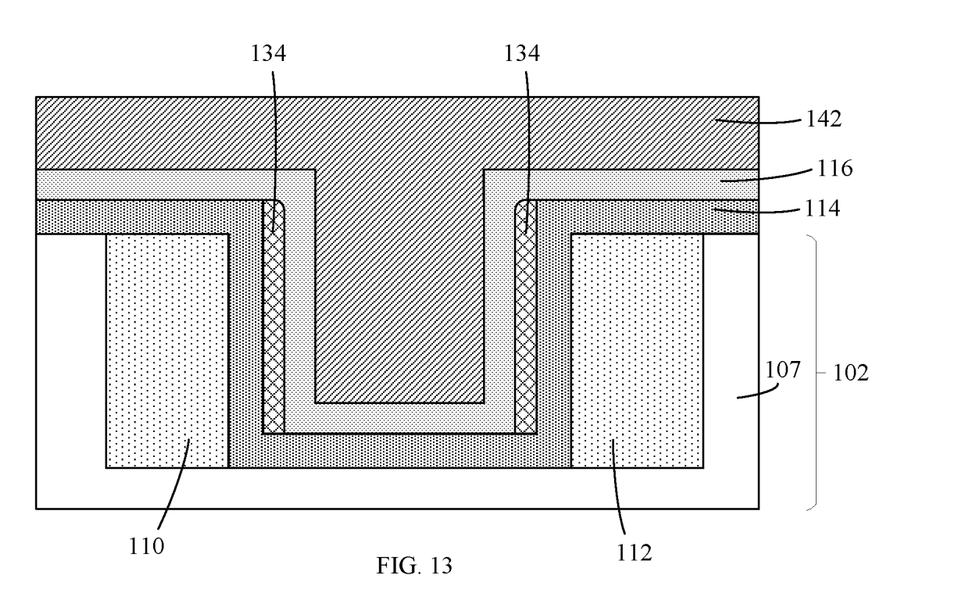

Referring to FIG. 13, the opening 146 may be filled with a metal layer 142. The metal layer 142 may be formed using deposition techniques. The metal layer 142 may be of a different material from the material in the source electrode 110 and the drain electrode 112. The metal layer 142 may also be formed on the hole generating layer 116.

Figure 14:
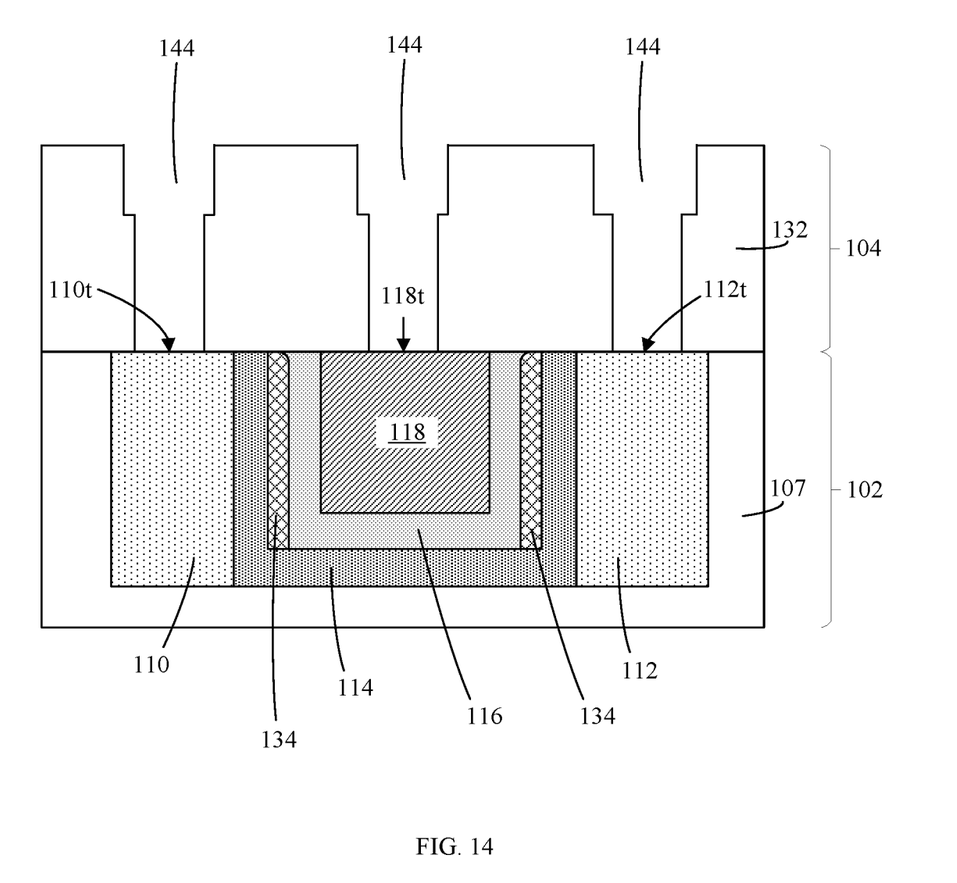

Referring to FIG. 14, a CMP process may be performed on the structure shown in FIG. 13 to remove portions of the metal layer 142, the hole generating layer 116, the dielectric channel layer 114, and the spacer layer 134. A control electrode 118 may be formed after the CMP process. The CMP process may also form an upper surface 110t of the source electrode 110, an upper surface 112t of the drain electrode 112, and an upper surface 118t of the control electrode 118. A second dielectric region 104 may be formed on the first dielectric region 102. The second dielectric region 104 may include a dielectric layer 132 which may be formed on the dielectric layer 107 using the deposition techniques described herein. Interconnect openings 144 may be formed in the dielectric layer 132 using patterning techniques. Vias and conductive lines, as described in FIG. 1, may be formed in the interconnect openings 144, for example, by forming a metal, such as cobalt (Co), copper (Cu), aluminum (Al), or an alloy thereof, in the interconnect openings 144. Other suitable types of metals or alloys may also be useful. The interconnect openings 144 may be formed such that they are aligned vertically above the upper surface 110t of the source electrode 110, the upper surface 112t of the drain electrode 112, and the upper surface 118t of the control electrode 118.

Throughout this disclosure, it is to be understood that if a method is described herein as involving a series of steps, the order of such steps as presented herein is not necessarily the only order in which such steps may be performed, and certain of the stated steps may possibly be omitted and/or certain other steps not described herein may possibly be added to the method. Furthermore, the terms "comprise", "include", "have", and any variations thereof, are intended to cover a non-exclusive inclusion, such that a process, method, article, or device that comprises a list of elements is not necessarily limited to those elements, but may include other elements not expressly listed or inherent to such process, method, article, or device. Occurrences of the phrase "in an embodiment" herein do not necessarily all refer to the same embodiment.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein. Furthermore, there is no intention to be bound by any theory presented in the preceding background or the following detailed description. Additionally, the various tasks and processes described herein may be incorporated into a more comprehensive procedure or process having additional functionality not described in detail herein.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/−10% of the stated value(s).

As will be readily apparent to those skilled in the art upon a complete reading of the present application, the disclosed semiconductor devices and methods of forming the same may be employed in manufacturing a variety of different integrated circuit products, including, but not limited to, memory cells, NV memory devices, FinFET transistor devices, CMOS devices, etc.

What is claimed is:

1. A memory structure comprising:
   a source electrode having an upper surface;
   a drain electrode having an upper surface;
   a dielectric channel layer laterally between the source electrode and the drain electrode, the dielectric channel layer has a horizontal segment laterally between two vertical segments;
   a hole generating layer on the dielectric channel layer, the hole generating layer has a horizontal segment laterally between two vertical segments, wherein the horizontal segment of the dielectric channel layer directly contacts the horizontal segment of the hole generating layer, and the two vertical segments of the dielectric channel layer are isolated from the two vertical segments of the hole generating layer by spacer layers; and a control electrode on the hole generating layer, the control electrode has an upper surface, wherein the upper surface of the control electrode is substantially coplanar with the upper surface of the source electrode and the upper surface of the drain electrode.

2. The memory structure of claim 1, wherein the control electrode has sides and a lower surface, and wherein the hole generating layer is on the sides and the lower surface of the control electrode.

3. The memory structure of claim 1, further comprising:
a first via on the upper surface of the control electrode;
a second via on the upper surface of the source electrode; and
a third via on the upper surface of the drain electrode, wherein the first via, the second via, and the third via have a same height.

4. The memory structure of claim 3, further comprising:
a first dielectric region, wherein the source electrode, the drain electrode, and the control electrode are in the first dielectric region; and
a second dielectric region on the first dielectric region, wherein the first via, the second via, and the third via are in the second dielectric region.

5. The memory structure of claim 1, wherein the hole generating layer includes a hydrogen doped dielectric material or a hydrogen doped metal.

6. The memory structure of claim 5, wherein the hole generating layer includes hydrogen doped silicon dioxide, platinum hydride, or palladium hydride.

7. The memory structure of claim 1, wherein the source and drain electrodes include a metal, and the dielectric channel layer includes an oxide of the metal in the source and drain electrodes.

8. The memory structure of claim 1, wherein the dielectric channel layer includes an oxide of tungsten, molybdenum, vanadium, or strontium cobalt alloy.

9. A memory structure comprising:
a dielectric region;
a source electrode in the dielectric region;
a drain electrode in the dielectric region;
a dielectric channel layer in the dielectric region, the dielectric channel layer is laterally between the source electrode and the drain electrode;
a hole generating layer in the dielectric region, the hole generating layer is on the dielectric channel layer; and
a control electrode in the dielectric region, the control electrode has sides and a lower surface, wherein the hole generating layer is on the sides and the lower surface of the control electrode, and
wherein the dielectric channel layer has a horizontal segment laterally between two vertical segments, the hole generating layer has a horizontal segment laterally between two vertical segments, and the horizontal segment of the dielectric channel layer directly contacts the horizontal segment of the hole generating layer, the two vertical segments of the dielectric channel layer are isolated from the two vertical segments of the hole generating layer by spacer layers.

10. The memory structure of claim 9, wherein the hole generating layer includes a hydrogen doped dielectric material or a hydrogen doped metal.

11. The memory structure of claim 10, wherein the hole generating layer includes hydrogen doped silicon dioxide or palladium hydride.

12. The memory structure of claim 9, wherein the source and drain electrodes include a metal, and the dielectric channel layer includes an oxide of the metal in the source and drain electrodes.

13. The memory structure of claim 9, wherein the dielectric channel layer includes an oxide of tungsten, molybdenum, vanadium, or strontium cobalt alloy.

14. The memory structure of claim 9, wherein the source electrode has an upper surface, the drain electrode has an upper surface, the control electrode has an upper surface, and wherein the upper surface of the control electrode is substantially coplanar with the upper surface of the source electrode and the upper surface of the drain electrode.

* * * * *